(12) United States Patent
Tsujita et al.

(10) Patent No.: US 9,703,057 B2
(45) Date of Patent: Jul. 11, 2017

(54) OPTO-ELECTRIC HYBRID BOARD, AND PRODUCTION METHOD THEREFOR

(71) Applicant: NITTO DENKO CORPORATION, Ibaraki-shi, Osaka (JP)

(72) Inventors: Yuichi Tsujita, Ibaraki (JP); Naoki Shibata, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/023,768

(22) PCT Filed: Jun. 24, 2014

(86) PCT No.: PCT/JP2014/066610
§ 371 (c)(1),
(2) Date: Mar. 22, 2016

(87) PCT Pub. No.: WO2015/045524
PCT Pub. Date: Apr. 2, 2015

(65) Prior Publication Data
US 2016/0216464 A1    Jul. 28, 2016

(30) Foreign Application Priority Data
Sep. 27, 2013   (JP) .................. 2013-201845
Apr. 22, 2014   (JP) .................. 2014-088166

(51) Int. Cl.
*G02B 6/42*   (2006.01)
*G02B 6/13*   (2006.01)
(Continued)

(52) U.S. Cl.
CPC ............ *G02B 6/428* (2013.01); *G02B 6/122* (2013.01); *G02B 6/13* (2013.01); *G02B 6/4283* (2013.01);
(Continued)

(58) Field of Classification Search
CPC .................. G02B 6/428; G02B 6/4283
See application file for complete search history.

(56) References Cited

U.S. PATENT DOCUMENTS

2006/0062522 A1*   3/2006   Lee .................. G02B 6/4232
                                                                   385/49
2010/0316335 A1*   12/2010   Furuyama ............ G02B 6/1221
                                                                   385/88
2012/0237158 A1   9/2012   Inoue et al.

FOREIGN PATENT DOCUMENTS

JP   60-35412 A     2/1985
JP   2010-266598 A   11/2010
(Continued)

OTHER PUBLICATIONS

Notification of Transmittal of Translation of the International Preliminary Report on Patentability (Form PCT/IB/338) issued in counterpart International Application No. PCT/JP2014/066610 mailed Apr. 7, 2016, with Forms PCT/IB/373 and PCT/ISA/237. (7 pages).

(Continued)

*Primary Examiner* — Omar R Rojas
(74) *Attorney, Agent, or Firm* — Westerman, Hattori, Daniels & Adrian, LLP

(57) ABSTRACT

An inventive opto-electric hybrid board includes: opto-electric module portions respectively provided on opposite end portions of an elongated insulation layer and including a first electric wiring of a first electrically conductive pattern and an optical element provided on a front surface of the insulation layer; and an interconnection portion provided on a portion of the insulation layer extending from the opto-electric module portions, and including an elongated optical waveguide on a back surface of the insulation layer optically coupled with the optical elements, and having a light signal transmission core. Further, an electrically conductive (Continued)

dummy pattern is provided on the front surface of the insulation layer in the interconnection portion for reinforcing the interconnection portion. The electrically conductive dummy pattern reinforces the interconnection portion to protect the waveguide from bending and twisting, while ensuring the flexibility of the interconnection portion. This suppresses increase in light transmission loss.

7 Claims, 7 Drawing Sheets

(51) Int. Cl.
| | |
|---|---|
| H05K 1/02 | (2006.01) |
| G02B 6/43 | (2006.01) |
| G02B 6/122 | (2006.01) |
| H05K 1/18 | (2006.01) |
| H05K 3/10 | (2006.01) |
| H05K 3/24 | (2006.01) |
| H05K 3/30 | (2006.01) |

(52) U.S. Cl.
CPC ............ *G02B 6/43* (2013.01); *H05K 1/0274* (2013.01); *H05K 1/181* (2013.01); *H05K 3/10* (2013.01); *H05K 3/24* (2013.01); *H05K 3/301* (2013.01); *G02B 6/4214* (2013.01); *G02B 6/4281* (2013.01); *H05K 1/0281* (2013.01); *H05K 2201/10121* (2013.01); *H05K 2201/2009* (2013.01)

(56) References Cited

FOREIGN PATENT DOCUMENTS

| | | |
|---|---|---|
| JP | 2011-249383 A | 12/2011 |
| JP | 2012-163739 A | 8/2012 |
| JP | 2012-194401 A | 10/2012 |

OTHER PUBLICATIONS

International Search Report dated Sep. 30, 2014, issued in counterpart International Application No. PCT/JP2014/066610 (2 pages).

* cited by examiner

_US 9,703,057 B2_

OPTO-ELECTRIC HYBRID BOARD, AND PRODUCTION METHOD THEREFOR

TECHNICAL FIELD

The present invention relates to an opto-electric hybrid board including an opto-electric module portion and an interconnection portion, and to a production method therefor.

BACKGROUND ART

In recent electronic devices and the like, optical wirings are employed in addition to electric wirings to cope with increase in information transmission amount. With a trend toward size reduction of the electronic devices and the like, there is a demand for a wiring board which has a smaller size and a higher integration density so as to be mounted in a limited space. An opto-electric hybrid board as shown in FIG. 10, for example, is proposed as such a wiring board. In the opto-electric hybrid board, an opto-electric module portion E including an electric wiring 13 of an electrically conductive pattern and an optical element 10 is provided on each (or one) of opposite end portions of a front surface of an insulation layer 12 such as of a polyimide, and an optical waveguide W (interconnection portion) including an under-cladding layer 20, a core 21 and an over-cladding layer 22 is provided on a back surface of the insulation layer 12 (opposite from the surface of the insulation layer 12 formed with the electric wiring 13) (see, for example PTL 1).

In the opto-electric hybrid board, a light signal transmitted through the core 21 of the optical waveguide W as shown by a one-dot-and-dash line P in FIG. 10 is converted into an electric signal by the optical element 10 of the opto-electric module portion E for electrical control. Further, an electric signal transmitted through the electric wiring 13 is converted into a light signal by the optical element 10. The light signal is transmitted through the optical waveguide W to another opto-electric module portion (not shown) provided on an opposite side, and taken out as an electric signal again.

In the opto-electric hybrid board, the insulation layer (such as of the polyimide) 12 contacts the optical waveguide W (such as made of an epoxy resin). Therefore, the optical waveguide W is liable to be stressed or slightly warped due to a difference in linear expansion coefficient between the insulation layer 12 and the optical waveguide W at an ambient temperature. This increases the light transmission loss of the optical waveguide W.

To cope with this, a metal reinforcement layer 11 such as of stainless steel is provided on the back surface of the insulation layer 12 in the opto-electric module portion E, whereby the stress and the slight warpage of the optical waveguide W are prevented to suppress the increase in light transmission loss. Without the provision of the metal reinforcement layer 11 in a portion of the opto-electric hybrid board other than the opto-electric module portion E, it is possible to ensure the flexibility of the optical waveguide W, so that the opto-electric hybrid board can be mounted in a smaller space to establish optical and electrical connections in a complicated positional relationship.

RELATED ART DOCUMENT

Patent Document

PTL1: JP-A-2012-194401

SUMMARY OF INVENTION

In the opto-electric hybrid board in which the opto-electric module portion E reinforced with the metal reinforcement layer 11 is connected to the flexible optical waveguide W, however, the optical waveguide W is liable to be pulled and twisted by the highly rigid metal reinforcement layer 11 at a boundary between the opto-electric module portion E and the optical waveguide W whenever the optical waveguide W is moved. Therefore, the optical waveguide W is liable to be broken or folded at the boundary. Further, a portion of the flexible optical waveguide W other than the boundary is liable to suffer from a slight light transmission loss. It is also strongly desirable to protect the optical waveguide W from the breakage and the folding in an entirely flexible opto-electric hybrid board not provided with the metal reinforcement layer 11.

In view of the foregoing, it is an object of the present invention to provide an excellent opto-electric hybrid board which includes a sufficiently flexible interconnection portion including an optical waveguide protected from bending and twisting and is substantially free from increase in light transmission loss, and to provide a production method for the opto-electric hybrid board.

According to a first aspect of the present invention to achieve the aforementioned object, there is provided an opto-electric hybrid board, which includes: an opto-electric module portion provided on at least one end portion of an elongated insulation layer, the opto-electric module portion including a first electric wiring of a first electrically conductive pattern and an optical element provided on a front surface of the insulation layer; and an interconnection portion provided on a portion of the insulation layer extending from the opto-electric module portion, the interconnection portion including an elongated optical waveguide provided on a back surface of the insulation layer; wherein the optical waveguide includes a light signal transmission core and is optically coupled with the optical element of the opto-electric module portion; wherein an electrically conductive dummy pattern is provided on the front surface of the insulation layer in the interconnection portion for reinforcing the interconnection portion.

According to a second inventive aspect, in addition to the first inventive aspect, the electrically conductive dummy pattern respectively extends continuously along at least opposite longitudinal edges of the front surface of the insulation layer in the interconnection portion of the opto-electric hybrid board. According to a third inventive aspect, the electrically conductive dummy pattern provided on the front surface of the insulation layer in the interconnection portion and the light signal transmission core of the optical waveguide provided on the back surface of the insulation layer are disposed in a vertically non-overlapping relation with each other, and the insulation layer intervenes between the electrically conductive dummy pattern and the light signal transmission core of the second inventive aspect.

In addition to the opto-electric hybrid board of the second or third inventive aspect in which the electrically conductive dummy pattern respectively extends continuously along the opposite longitudinal edges of the front surface of the insulation layer in the interconnection portion, according to a fourth inventive aspect, the opto-electric hybrid board further comprises a second electric wiring of a second electrically conductive pattern longitudinally extending along an inward portion of the front surface of the insulation layer in the interconnection portion, wherein the second electric wiring of the second electrically conductive pattern is provided between two portions of the aforementioned electrically conductive dummy pattern in the interconnection portion.

According to a fifth inventive aspect, the second electric wiring provided between the two portions of electrically conductive dummy pattern on the front surface of the insulation layer in the interconnection portion and the light signal transmission core of the optical waveguide provided on the back surface of the insulation layer are disposed in a vertically non-overlapping relation with each other, and the insulation layer intervenes between the second electric wiring and the light signal transmission core of the fourth inventive aspect.

According to a sixth inventive aspect, there is provided a method for producing the opto-electric hybrid board of any one of the first to third inventive aspects, the method including the step of simultaneously forming the first electrically conductive pattern of the first electric wiring in the opto-electric module portion and the electrically conductive dummy pattern of the interconnection portion to reinforce the interconnection portion.

According to a seventh inventive aspect, there is provided a method for producing the opto-electric hybrid board of the fourth or fifth inventive aspect, the method including the step of simultaneously forming the first electrically conductive pattern of the first electric wiring in the opto-electric module portion, the electrically conductive dummy pattern of the interconnection portion to reinforce the interconnection portion and the second electrically conductive pattern of the second electric wiring between two portions of the aforementioned electrically conductive dummy pattern in the interconnection portion.

In the inventive opto-electric hybrid board, the electrically conductive dummy pattern is provided in the same manner as the first electrically conductive pattern of the first electric wiring on the front surface of the insulation layer in the interconnection portion connected between the opto-electric module portions. This makes it possible to protect the optical waveguide from the bending and the twisting while ensuring the flexibility of the interconnection portion. Even if the opto-electric module portions and the interconnection portion receive an impact, or the interconnection portion is loaded to be bent, it is possible to prevent the core of the optical waveguide from being stressed or slightly bent and to suppress the increase in the light transmission loss of the optical waveguide. Therefore, the inventive opto-electric hybrid board is excellent in flexibility and substantially free from the increase in light transmission loss and, hence, has a higher quality.

In the inventive opto-electric hybrid board, particularly, the electrically conductive dummy pattern includes at least two dummy pattern portions respectively extending continuously along the opposite longitudinal edges of the front surface of the insulation layer in the interconnection portion. This arrangement is particularly effective in reinforcing the interconnection portion longitudinally of the interconnection portion. This effectively prevents the interconnection portion from being folded or twisted, and effectively prevents the optical waveguide from suffering from the light transmission loss.

In the inventive opto-electric hybrid board, particularly, the electrically conductive dummy pattern provided on the front surface of the insulation layer in the interconnection portion and the light signal transmission core of the optical waveguide provided on the back surface of the insulation layer are disposed in a vertically non-overlapping relation with each other, and the insulation layer intervenes between the electrically conductive dummy pattern and the light signal transmission core. This arrangement is advantageous to suppress the light transmission loss of the optical waveguide. That is, if the electrically conductive pattern and the core are to be disposed in vertically overlapping relation, light would be reflected on a back surface of the electrically conductive dummy pattern 30 provided on the surface of the insulation layer 1 opposite from a core formation layer 8a as indicated by arrows X in FIG. 11 during light exposure for formation of the core in the optical waveguide fabricating step. Therefore, the resulting core 8 would have sidewalls roughened by the influence of the reflected light. This so-called "roughening" would cause the light transmission loss in the resulting optical waveguide. In contrast, the aforementioned arrangement eliminates the possibility of the light transmission loss.

In the inventive opto-electric hybrid board, particularly, the electrically conductive dummy pattern includes two portions of the electrically conductive dummy pattern respectively extending continuously along the opposite longitudinal edges of the front surface of the insulation layer in the interconnection portion, and the second electric wiring of the second electrically conductive pattern is provided on the longitudinally extending along an inward portion of the front surface of the insulation layer between the aforementioned electrically conductive dummy patterns. Therefore, the opto-electric hybrid board is capable of properly transmitting both light signals and electric signals in the interconnection portion, and advantageously has a wider range of applications.

In the inventive opto-electric hybrid board, particularly, the second electric wiring provided between the electrically conductive dummy patterns on the front surface of the insulation layer in the interconnection portion and the light signal transmission core of the optical waveguide provided on the back surface of the insulation layer are disposed in a vertically non-overlapping relation with each other, and the insulation layer intervenes between the second electric wiring and the light signal transmission core. Even if light is reflected on the back surface of the second electric wiring provided on the surface of the insulation layer opposite from the core formation surface during light exposure in the optical waveguide fabricating step, the sidewalls of the core are not influenced by the reflected light as in the case in which the electrically conductive dummy pattern and the core are disposed in vertically non-overlapping relation. This further suppresses the light transmission loss of the resulting optical waveguide.

In the production method according to the invention, the formation of the electrically conductive dummy pattern in the interconnection portion can be produced at the same time as the formation of the first electrically conductive pattern in the module potion, which is essentially required for the inventive opto-electric hybrid board. This avoids unnecessary steps, and makes it possible to easily provide the inventive opto-electric hybrid board at lower costs.

DESCRIPTION OF EMBODIMENTS

Embodiments of the present invention will hereinafter be described in detail based on the drawings.

Figure 1A:
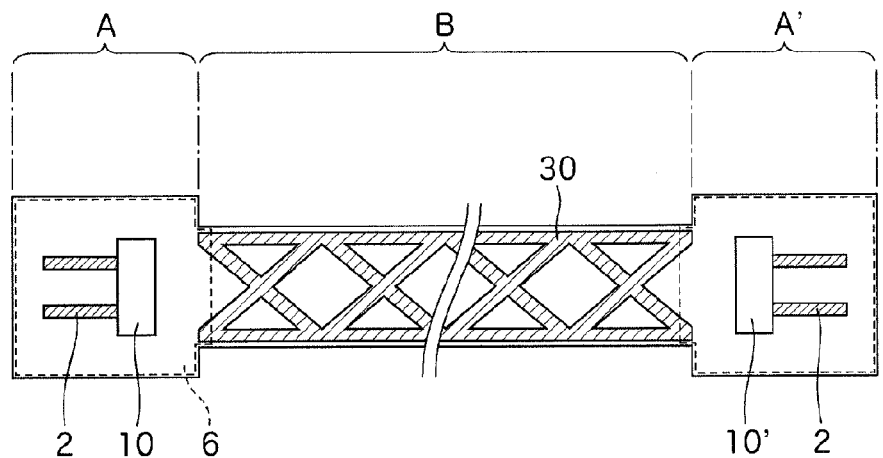
FIG. 1A is a schematic plan view illustrating an opto-electric hybrid board according to one embodiment of the present invention.
Figure 1B:
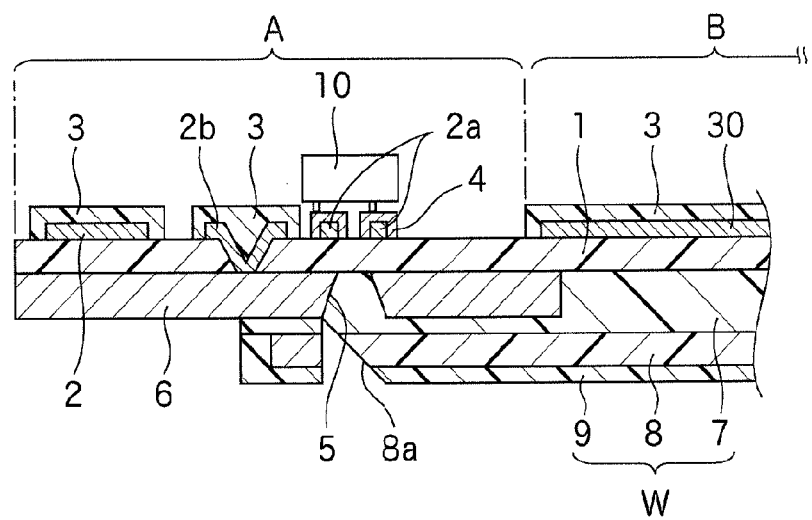
FIG. 1B is an explanatory diagram schematically illustrating a major portion of the opto-electric hybrid board on an enlarged scale.

FIG. 1A is a plan view schematically illustrating an opto-electric hybrid board according to one embodiment of the present invention, and FIG. 1B is an explanatory diagram schematically illustrating a major portion of the opto-electric hybrid board on an enlarged scale.

The opto-electric hybrid board includes a pair of left and right opto-electric module portions A, A' each having a generally square plan shape and an interconnection portion B provided between the opto-electric module portions A, A', and has an elongated shape as a whole. More specifically, a unitary elongated insulation layer 1 (in this embodiment, a transparent polyimide layer) is employed as a substrate, and the opto-electric module portions A, A' are respectively provided on left and right end portions of a front surface of the insulation layer 1 and each include an optical element 10, 10' and a first electric wiring 2 of a first electrically conductive pattern. In this embodiment, the optical element 10 of the opto-electric module portion A serves as a light receiving element which receives a light signal and converts the light signal to an electric signal. The optical element 10' of the opto-electric module portion A' serves as a light emitting element which receives an electric signal and converts the electric signal to a light signal (description of the opto-electric module portion A' will hereinafter be omitted). The interconnection portion B includes an optical waveguide W provided on a back surface of the insulation layer 1 between the left and right opto-electric module portions A, A', and serves for transmitting light signals. The opto-electric module portions A, A' each further include an integrated circuit (IC), an active element and the like for driving the optical element 10, 10' as required. In this embodiment, illustration and description of these elements will be omitted. The opto-electric module portions A, A' may each further include a connector for connection to another electric circuit board or the like.

In the opto-electric module portion A, the first electric wiring 2 is provided as having a predetermined first electrically conductive pattern, which includes pads 2a for mounting the optical element 10 and ground electrodes 2b. The pads 2a each have a surface coated with a gold plating layer 4 for increasing the electrical conductivity thereof. A portion of the first electric wiring 2 other than the pads 2a is covered with a cover lay 3 to be protected for insulation (in FIG. 1A, the cover lay 3 is not shown).

A metal reinforcement layer 6 (in this embodiment, a stainless steel layer) having an outer shape generally conforming to the outer shape of the opto-electric module portion A is provided on the back surface of the insulation layer 1 so as to stably maintain the planarity of the opto-electric module portion A. A reference numeral 5 designates a through-hole through which the optical element 10 is optically coupled with the optical waveguide W.

On the back surface of the insulation layer 1, the optical waveguide W extends from the interconnection portion B, and a distal end portion of the optical waveguide W is optically coupled with the optical element 10 provided on the front side of the insulation layer 1 through the through-hole 5 of the metal reinforcement layer 6. More specifically, the optical waveguide W includes an under-cladding layer 7, a plurality of cores 8 arranged parallel to each other below the under-cladding layer 7, and an over-cladding layer 9 covering the cores 8. The under-cladding layer 7, the core 8 and the over-cladding layer 9 are provided in this order downward from the back surface of the insulation layer 1. The under-cladding layer 7 partly enters the through-hole 5 into contact with the metal reinforcement layer 6.

In the interconnection portion B provided between the opto-electric module portions A and A', as described above, the optical waveguide W extends on the back surface of the insulation layer 1. An electrically conductive dummy pattern 30 of an oblique lattice shape irrelevant to the transmission of electric signals is provided on the entire front surface of the insulation layer 1 in the interconnection portion B. The electrically conductive dummy pattern 30 increases the strength of the flexible interconnection portion B including the insulation layer 1 and the optical waveguide W, while ensuring the flexibility of the interconnection portion B. Even if the opto-electric hybrid board is repeatedly bent, rubbed or twisted, the opto-electric module portions A, A' are prevented from being broken or folded at a boundary between the opto-electric module portions A, A' and the interconnection portion B and in other portions. Further, the optical waveguide W is capable of properly transmitting light signals without increase in light transmission loss. This is a major characteristic feature of the present invention.

The surface of the electrically conductive dummy pattern 30 is covered with the cover lay 3 to be protected for insulation. The cover lay 3 also enhances the effect of reinforcing the interconnection portion B.

The opto-electric hybrid board may be produced, for example, in the following manner.

Figure 2A:
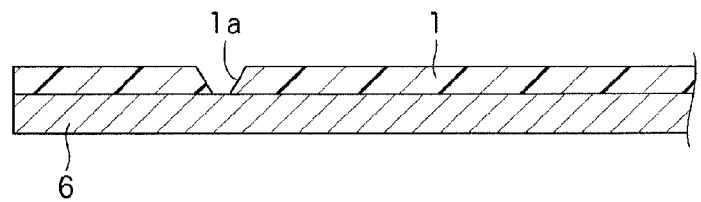
FIGS. 2A to 2E are schematic diagrams for explaining an opto-electric module portion fabricating step in a production method for the opto-electric hybrid board.

First, as shown in FIG. 2A, a flat metal reinforcement layer 6 is prepared. Exemplary materials for the metal reinforcement layer 6 include stainless steel, copper, silver, aluminum, nickel, chromium, titanium, platinum and gold, among which stainless steel is preferred for strength and bendability. The metal reinforcement layer 6 preferably has a thickness in a range of 10 to 70 μm.

Then, a photosensitive insulative resin such as containing a polyimide resin is applied onto a surface of the metal reinforcement layer 6, and formed into an insulation layer 1 of a predetermined pattern by a photolithography process. In this embodiment, holes 1a through which the surface of the metal reinforcement layer 6 are partly exposed are formed at predetermined positions in the insulation layer 1 for formation of ground electrodes 2b in contact with the metal reinforcement layer 6. The insulation layer 1 preferably has a thickness in a range of 3 to 50 μm.

Figure 2B:
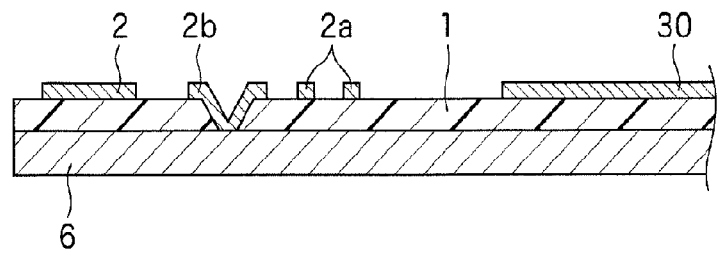

In turn, as shown in FIG. 2B, a first electrically conductive pattern of a first electric wiring 2 (including pads 2a for mounting an optical element 10, and the ground electrodes 2b) in an opto-electric module portion A and an electrically conductive dummy pattern 30 in an interconnection portion B are simultaneously formed, for example, by a semi-additive method. In this method, a metal film (not shown) such as of copper is formed on a surface of the insulation layer 1 by sputtering or electroless plating. The metal film serves as a seed layer (a base layer for formation of an electro-plating layer) in the subsequent electro-plating step. Subsequently, a photosensitive resist (not shown) is applied to both surfaces of a stack including the metal reinforcement layer 6, the insulation layer 1 and the seed layer, and then holes for a first electrically conductive pattern of the first electric wiring 2 are formed in a photosensitive resist layer present on the seed layer by a photolithography process. Thus, surface portions of the seed layer are exposed in bottoms of the holes.

In turn, an electro-plating layer of an electrically conductive material such as copper is formed on the surface portions of the seed layer exposed in the bottoms of the holes. Then, the photosensitive resist is lifted off by a sodium hydroxide aqueous solution. Thereafter, a portion of the seed layer not formed with the electro-plating layer is removed by soft etching. Remaining portions of a stack of the seed layer and the electro-plating layer serve as the first electric wiring 2 (including the optical element mounting pads 2a and the ground electrodes 2b) and the electrically conductive dummy pattern 30 (see FIG. 1A). Preferred examples of the electrically conductive material include highly electrically conductive and highly ductile metal materials such as chromium, aluminum, gold and tantalum in addition to copper. Other preferred examples of the electrically conductive material include alloys containing at least one of these metals. The first electric wiring 2 and the electrically conductive dummy pattern 30 preferably each have a thickness in a range of 3 to 30 μm. Where the thicknesses of the first electric wiring 2 and the electrically conductive dummy pattern 30 fall within this range, the first electric wiring 2 serves its purpose without any inconvenience. In addition, the electrically conductive dummy pattern 30 can protect and reinforce the optical waveguide W without impairing the flexibility of the interconnection portion B.

Figure 2C:
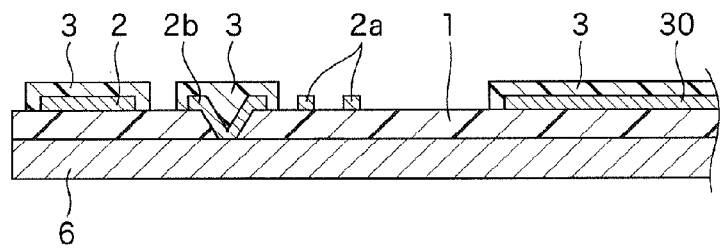

Subsequently, as shown in FIG. 2C, an electroless plating layer (not shown) such as of nickel is formed on a surface of the first electric wiring 2 for the opto-electric module portion A, and then a photosensitive insulative resin such as containing a polyimide resin is applied and patterned by a photolithography process to form a cover lay 3 on the electrically conductive dummy pattern 30 and a portion of the first electric wiring 2 other than the optical element mounting pads 2a. The cover lay 3 preferably has a thickness in a range of 1 to 20 μm. Where the thickness of the cover lay 3 falls within this range, the cover lay 3 can effectively protect the first electric wiring 2 and the electrically conductive dummy pattern 30. Particularly, in the interconnection portion B, the cover lay 3 as well as the electrically conductive dummy pattern 30 can effectively protect and reinforce the optical waveguide W.

Figure 2D:
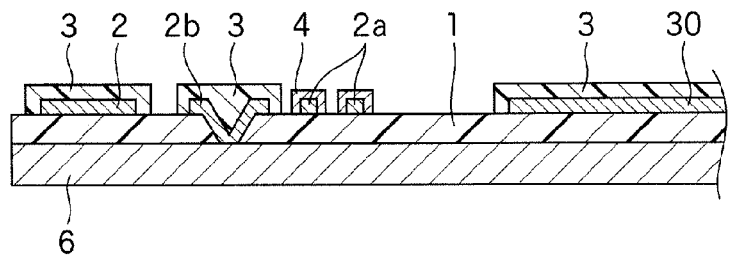

In turn, as shown in FIG. 2D, parts of the electroless plating layer (not shown) formed on the pads 2a of the first electric wiring 2 are removed by etching, and then an electro-plating layer 4 such as of gold or nickel (in this embodiment, a gold plating layer) is formed on the pads 2a from which the electroless plating layer has been removed.

Subsequently, a photosensitive resist (not shown) is applied on both surfaces of a stack of the metal reinforcement layer 6 and the insulation layer 1, and then holes are formed in a photosensitive resist layer present on the back surface of the metal reinforcement layer 6 (opposite from that formed with the first electric wiring 2) by a photolithography process, so that back surface portions of the metal reinforcement layer 6 are exposed in the holes as corresponding to parts of the metal reinforcement layer 6 to be removed (for an interconnection portion B and a light path through-hole).

Figure 2E:
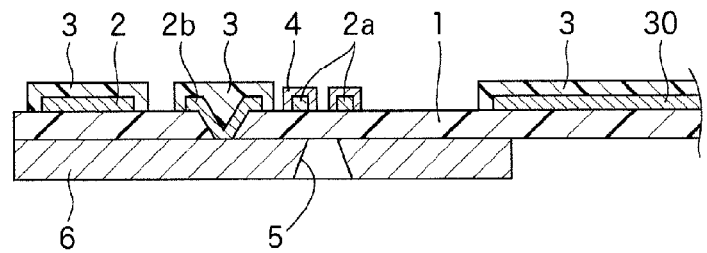

Then, as shown in FIG. 2E, the parts of the metal reinforcement layer 6 exposed in the holes are removed by etching with the use of an etching aqueous solution suitable for the material for the metal reinforcement layer 6 (where the metal reinforcement layer 6 is a stainless steel layer, for example, with the use of a ferric chloride aqueous solution), whereby the insulation layer 1 is exposed from the removed parts. Thereafter, the photosensitive resist is lifted off with the use of a sodium hydroxide aqueous solution.

Figure 3A:
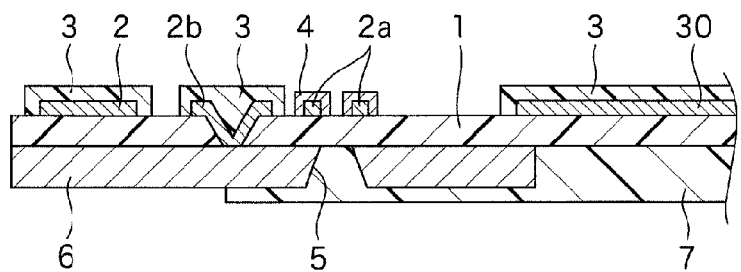
FIGS. 3A to 3D are schematic diagrams for explaining an interconnection portion fabricating step in the opto-electric hybrid board production method.

Subsequently, an optical waveguide W (see FIG. 1B) is fabricated on the back surfaces of the insulation layer 1 and the metal reinforcement layer 6. More specifically, as shown in FIG. 3A, a photosensitive resin as a material for an under-cladding layer 7 is first applied on the back surfaces (lower surfaces in FIG. 3A) of the insulation layer 1 and the metal reinforcement layer 6, and then the resulting layer is cured by exposure to radiation. Thus, the under-cladding layer 7 is formed. The under-cladding layer 7 preferably has a thickness in a range of 3 to 50 μm (as measured from the back surface of the metal reinforcement layer 6). The under-cladding layer 7 may be patterned in a predetermined pattern by a photolithography process.

Figure 3B:
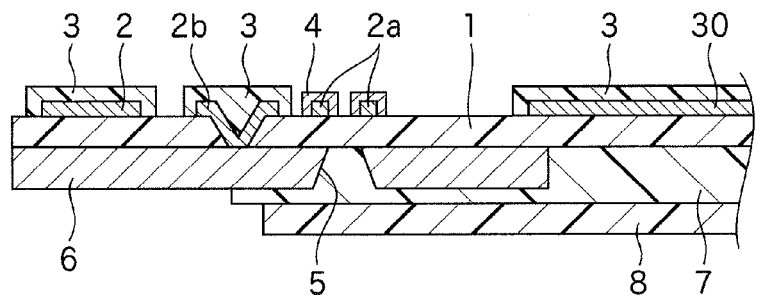

Then, as shown in FIG. 3B, a core 8 is formed in a predetermined pattern on a surface (a lower surface in FIG. 3B) of the under-cladding layer 7 by a photolithography process. The core 2 preferably has a thickness in a range of 20 to 100 μm. The core 8 preferably has a width in a range of 10 to 100 μm. An exemplary material for the core 8 is the same type of photosensitive resin as the under-cladding layer 7, but has a higher refractive index than the materials for the under-cladding layer 7 and an over-cladding layer 9 to be described later (see FIG. 3C). The refractive index may be controlled in consideration of the formulation and the selection of the types of the materials for the under-cladding layer 7, the core 8 and the over-cladding layer 9.

Figure 3C:
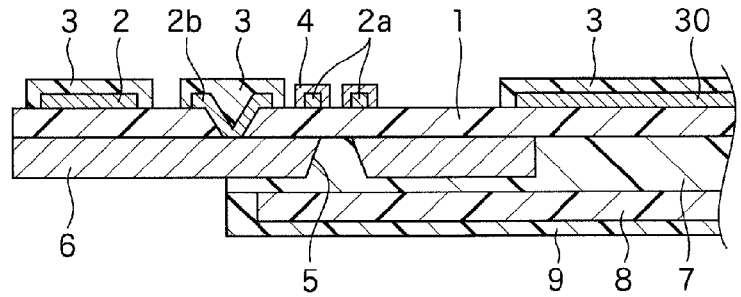

Subsequently, as shown in FIG. 3C, the over-cladding layer 9 is formed over a surface (a lower surface in FIG. 3C) of the under-cladding layer 7 by a photolithography process to cover the core 8. The over-cladding layer 9 has a greater thickness than the core 8, i.e., preferably has a thickness of not greater than 300 μm (as measured from the surface of the under-cladding layer 7). An exemplary material for the over-cladding layer 9 is the same type of photosensitive resin as the under-cladding layer 7. For the formation of the over-cladding layer 9, the photosensitive resin may be patterned into a predetermined pattern by a photolithography process.

Figure 3D:
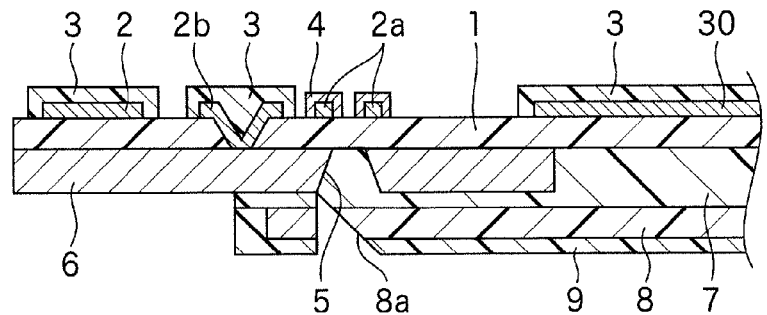

Then, as shown in FIG. 3D, a light reflecting surface 8a inclined at 45 degrees with respect to a longitudinal axis of the core 8 is formed in a portion of the optical waveguide W (each end portion of the optical waveguide W as seen in FIG. 1B) associated with the pads 2a provided on the front surface of the insulation layer 1 by a laser processing method, a cutting method or the like. Then, an optical element 10 is mounted on the pads 2a. Thus, an intended opto-electric hybrid board is provided.

In the opto-electric hybrid board thus provided, the electrically conductive dummy pattern 30 is provided on the front side of the interconnection portion B connected between the opto-electric module portions A and A'. This enhances the strength of the interconnection portion B without impairing the flexibility of the interconnection portion B. Even if the opto-electric module portions A, A' and the interconnection portion B of the opto-electric hybrid board receive an impact, or the interconnection portion B is loaded to be bent, it is possible to prevent the breakage and the folding of the opto-electric hybrid board at boundaries between the opto-electric module portions A, A' and the interconnection portion B. Since the strength of the entire interconnection portion B is enhanced, it is possible to prevent the core 8 of the optical waveguide W from being stressed or slightly bent and to suppress the increase in the light transmission loss of the optical waveguide W.

In the production method described above, the surface of the electrically conductive dummy pattern 30 is covered with the cover lay 3, but the electrically conductive dummy pattern 30, which is not designed for transmission of electricity, is not necessarily required to be covered with the cover lay 3. However, it is more preferred to cover the surface of the electrically conductive dummy pattern 30 with the cover lay 3, because the interconnection portion B is more effectively protected and reinforced.

In the production method described above, the pads 2a of the first electric wiring 2 for mounting the optical element 10 are covered with the gold plating layer 4, but the coverage with the plating layer is not necessarily required depending on the material for the first electric wiring 2 and the required characteristic properties of the electric wiring 2.

In the embodiment described above, the left and right opto-electric module portions A, A' are imparted with certain rigidity and hence with planarity by providing the metal reinforcement layer 6 on the back surface of the insulation layer 1 in the opto-electric module portions A, A'. However, the metal reinforcement layer 6 is not necessarily required, but the opto-electric module portions A, A' may be entirely flexible. Further, it is not necessarily required to provide the pair of left and right opto-electric module portions A, A' on opposite sides of the interconnection portion B, but only one of the opto-electric module portions may be provided on one side of the interconnection portion B. A distal end of the interconnection portion B may be connected to the other opto-electric module portion via a connector or the like.

Figure 4A:
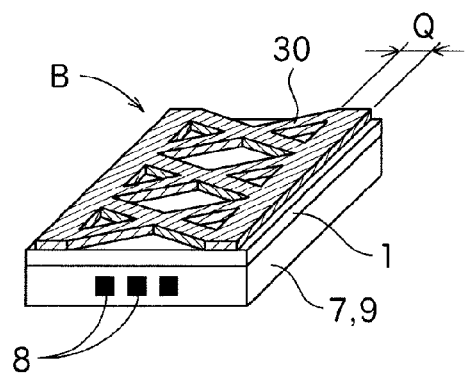
FIG. 4A is a partial perspective view showing the configuration of an electrically conductive dummy pattern in the aforementioned embodiment.
Figure 4B:
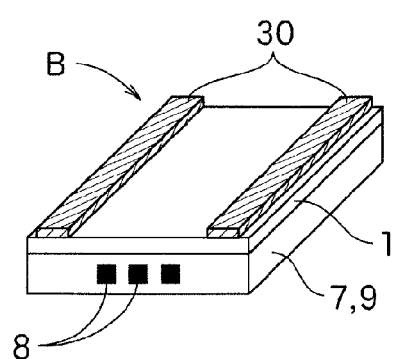
FIG. 4B is a partial perspective view showing a modification of the electrically conductive dummy pattern.

In the embodiment described above, the electrically conductive dummy pattern 30 provided on the front side of the interconnection portion B has an oblique lattice shape as shown in FIG. 4A. In the present invention, the electrically conductive dummy pattern 30 is not necessarily required to have such a shape. For example, as shown in FIG. 4B, the electrically conductive dummy pattern 30 may be configured to include dummy pattern portions respectively extending continuously along opposite longitudinal edges of the interconnection portion B on the front surface of the insulation layer 1. This configuration provides a reinforcement effect when at least the interconnection portion B is bent longitudinally.

Figure 11:
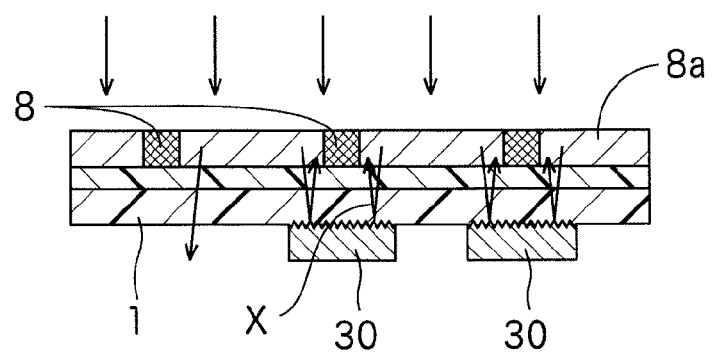
FIG. 11 is a schematic diagram for explaining the arrangement of an electrically conductive dummy pattern and a core.

In addition, the electrically conductive dummy pattern provided on the front surface of the insulation layer 1 and the light signal transmission core 8 of the optical waveguide W provided on the back surface of the insulation layer 1 are disposed in vertically non-overlapping relation with the intervention of the insulation layer 1 in this embodiment. Therefore, even if light is reflected on the back surface of the electrically conductive dummy pattern 30 provided on the front surface of the insulation layer 1 (as indicated by arrows X in FIG. 11) during light exposure for formation of the core 8 in the optical waveguide fabricating step, sidewalls of the resulting core 8 are free from so-called "roughening" so that the light transmission loss of the optical waveguide W is effectively suppressed.

The electrically conductive dummy pattern 30 preferably has an oblique lattice shape as shown in FIG. 4A, because the electrically conductive dummy pattern 30 provides a reinforcement effect against the longitudinal bending of the interconnection portion B and against widthwise and oblique twisting and bending of the interconnection portion B. Thus, the protection/reinforcement effect of the electrically conductive dummy pattern 30 on the interconnection portion B depends upon the pattern configuration of the electrically conductive dummy pattern 30. In order to balance the flexibility and the protection/reinforcement effect, the surface coverage percentage of the interconnection portion B with the electrically conductive dummy pattern 30 is preferably about 20% to about 80%.

Figure 5A:
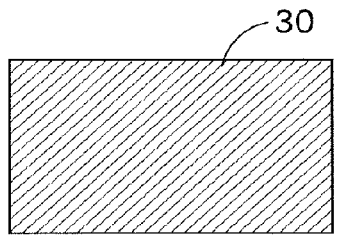
FIGS. 5A to 5E are partial plan views showing other modifications of the electrically conductive dummy pattern.
Figure 5B:
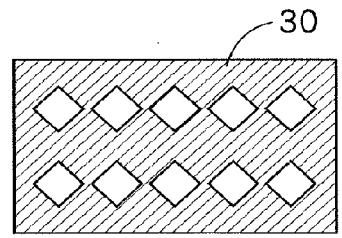
Figure 5C:
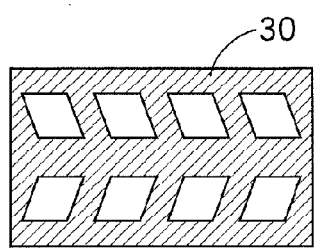
Figure 5D:
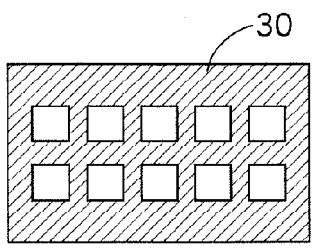
Figure 5E:
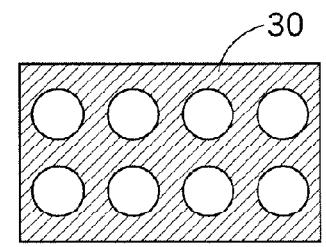
Figure 6A:
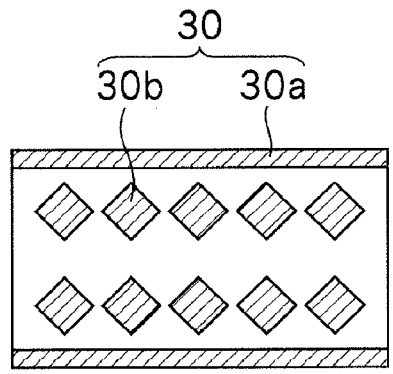
FIGS. 6A to 6D are partial plan views showing further other modifications of the electrically conductive dummy pattern.
Figure 6B:
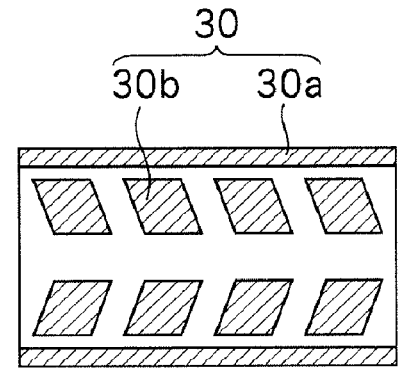
Figure 6C:
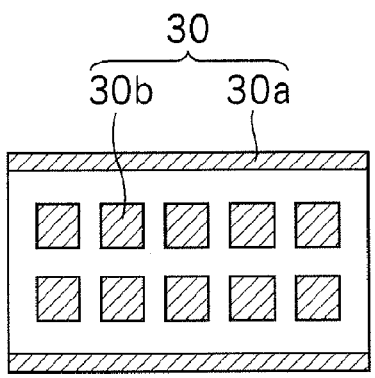
Figure 6D:
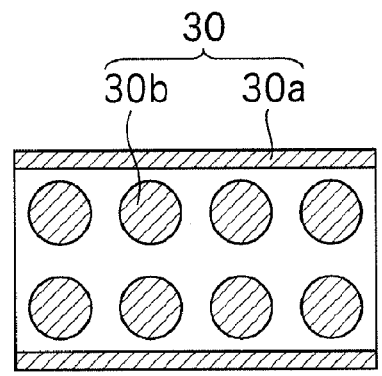

The shape of the electrically conductive dummy pattern 30 may be selected from many variations according to the reinforcement degree to be required with or without consideration of the arrangement of the core 8 of the optical waveguide W. Where the electrically conductive pattern 30 is configured so as to cover the entire front surface of the interconnection portion B as shown in FIG. 5A, for example, the interconnection portion B is less flexible, but is imparted with a higher strength to be thereby properly protected. Further, the electrically conductive dummy pattern 30 may be configured to have a plurality of rhombic, parallelogram, square or round openings regularly arranged as shown in FIGS. 5B to 5E so as to provide a sufficient reinforcement effect while ensuring the flexibility.

The electrically conductive dummy pattern 30 may be configured to include a plurality of rhombic, parallelogram, square or round dummy pattern portions 30b regularly arranged and opposite edge portions 30a extending along opposite longitudinal edges thereof with the other portion thereof removed as shown in FIGS. 6A to 6D so as to provide a sufficient reinforcement effect while ensuring the flexibility. In this case, the opposite edge portions 30a may be removed, but this arrangement is less preferred because the reinforcement effect against the bending is reduced and the inside dummy pattern portions 30b of the electrically conductive dummy pattern 30 are liable to be separated or detached.

Figure 7:
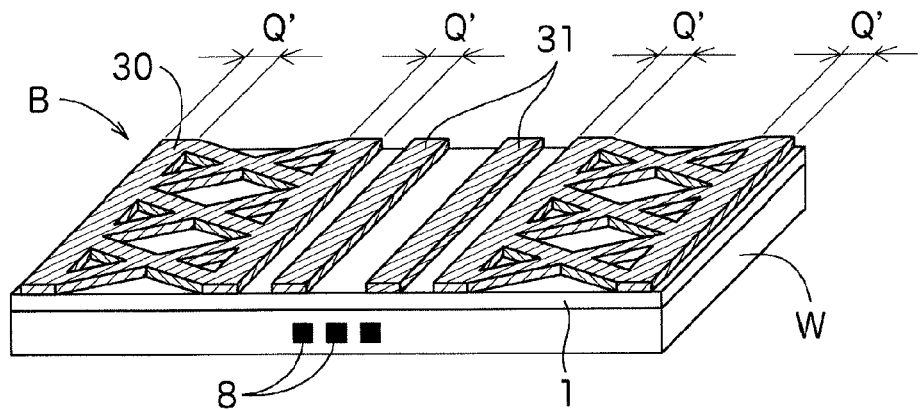
FIG. 7 is a partial perspective view illustrating an opto-electric hybrid board according to another embodiment of the present invention.
Figure 8A:
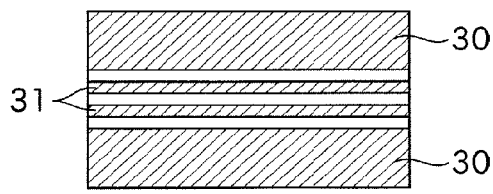
FIGS. 8A to 8D are explanatory diagrams showing modifications of the electrically conductive dummy pattern of the another embodiment.
Figure 8B:
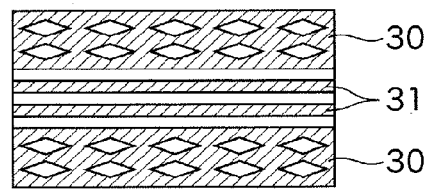
Figure 8C:
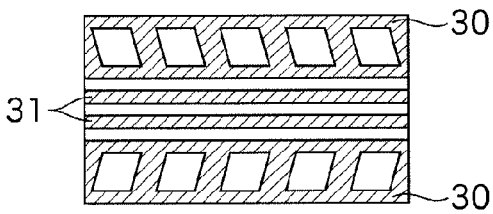
Figure 8D:
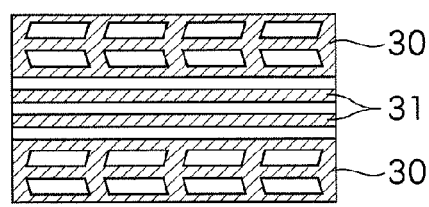

Further, as shown in FIG. 7, electrically conductive dummy patterns 30 are provided on the front surface of the insulation layer 1 as respectively extending continuously along the opposite longitudinal edges of the interconnection portion B, and a second electric wiring 31 of a predetermined second electrically conductive pattern (in this embodiment, two linear patterns each extending longitudinally) may be provided on a longitudinally extending inward portion of the insulation layer 1 defined between the electrically conductive dummy patterns 30. With this arrangement, light signals are transmitted through the optical waveguide W provided on the back surface of the insulation layer 1, and electric signals are transmitted through the second electric wiring 31 provided on the front surface of the insulation layer 1 in the interconnection portion B. Thus, a greater amount of information can be transmitted.

The provision of the second electric wiring 31 between the electrically conductive dummy patterns 30 respectively extending along the opposite longitudinal edges of the interconnection portion B advantageously makes it possible to ensure the planarity of the interconnection portion B while allowing for proper electrical and optical transmission.

Where the second electric wiring 31 is provided in the interconnection portion B, the electrically conductive dummy patterns 30 provided on the opposite sides of the electric wiring 31 may be configured in various ways, for example, as shown in FIGS. 8A to 8D. In any of these cases, the electrically conductive dummy patterns 30 desirably extend continuously along the opposite longitudinal edges as described above.

Figure 9A:
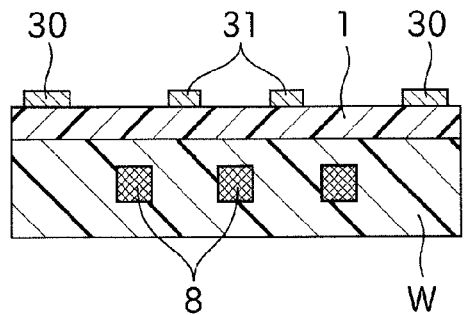
FIGS. 9A and 9B are explanatory diagrams showing modifications of the second electric wirings of the another embodiment.
Figure 9B:
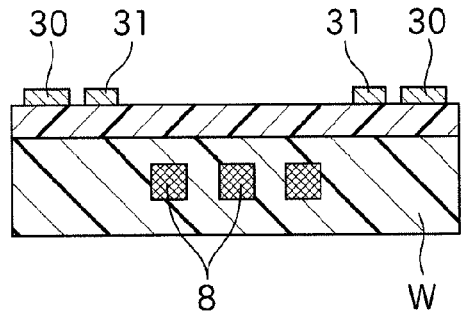
Figure 10:
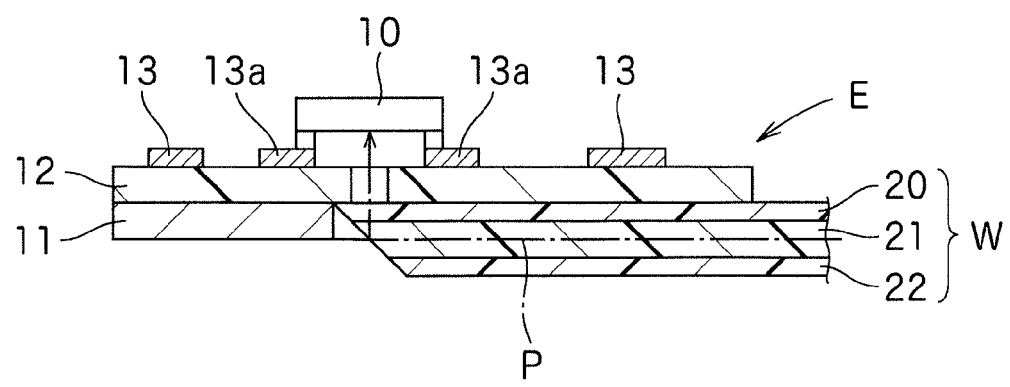
FIG. 10 is a longitudinal sectional view schematically showing an exemplary opto-electric hybrid board according to a prior art.

Like the electrically conductive dummy patterns 30, the second electric wiring 31 is preferably disposed in vertically non-overlapping relation with respect to the core 8 of the optical waveguide W with the intervention of the insulation layer 1. For example, as shown in a transverse sectional view of FIG. 9A, longitudinally extending a plurality of second electric wirings 31 are disposed in staggered relation with respect to a plurality of cores 8 with the intervention of the insulation layer 1 in the interconnection portion B. Further, as shown in FIG. 9B, the second electric wirings 31 may be respectively provided in juxtaposed relation with respect to the electrically conductive dummy patterns 30 on opposite longitudinal edge portions of the front surface of the insulation layer 1, and the cores 8 may be provided in juxtaposition on a wider middle portion of the back surface of the insulation layer 1. With these arrangements, even if light is reflected on back surfaces of the second electric wirings 31 provided on the surface of the insulation layer 1 opposite from the core formation surface during light exposure in the optical waveguide fabricating step, as in the case in which the electrically conductive dummy pattern 30 and the core 8 are disposed in vertically non-overlapping relation, sidewalls of the resulting cores 8 are free from the influence of the reflected light and, hence, so-called "roughening" so that the light transmission loss of the resulting optical waveguide W is more effectively suppressed.

In order to prevent the interconnection portion B from being bent longitudinally, the electrically conductive dummy patterns 30 preferably respectively include at least longitudinal edge portions extending continuously along the opposite longitudinal edges of the front surface of the insulation layer 1, irrespective of the provision of the second electric wirings 31 between the electrically conductive dummy patterns 30. The longitudinal edge portions typically each have a width (indicated by a reference character Q in FIG. 4A) of 30 to 1000 μm, depending upon the overall size of the interconnection portion B.

Next, inventive examples will be described in conjunction with a comparative example. It is noted that the invention be not limited to the following inventive examples.

EXAMPLES

Example 1

The opto-electric hybrid board shown in FIGS. 1A and 1B was produced in the aforementioned manner. The interconnection portion B had a length of 20 cm. A 20-μm thick stainless steel layer was provided as the metal reinforcement layer. The insulation layer had a thickness of 5 μm, and the under-cladding layer had a thickness of 10 μm (as measured from the back surface of the insulation layer). The core had a thickness of 50 μm and a width of 50 μm. The over-cladding layer had a thickness of 70 μm (as measured from the front surface of the under-cladding layer). The first electric wiring and the electrically conductive dummy pattern had a thickness of 5 μm. The electrically conductive dummy pattern had an oblique lattice shape, and covered the insulation layer at a surface coverage percentage of 44%. The electrically conductive dummy pattern had edge portions respectively extending continuously along the opposite longitudinal edges of the interconnection portion and each having a width of 400 μm (as indicated by a reference character Q in FIG. 4A).

Example 2

An opto-electric hybrid board having substantially the same basic construction as in Example 1, except that electrically conductive dummy patterns were formed in an arrangement as shown in FIG. 7 and no second electric wiring was formed. The electrically conductive dummy patterns covered the surface of the insulation layer at a surface coverage percentage of 40%. Longitudinal edge portions of the electrically conductive dummy patterns respectively extending continuously along the opposite longitudinal edges of the insulation layer each had a width (indicated by a reference character Q' in FIG. 7) of 400 μm.

Comparative Example 1

An opto-electric hybrid board was produced in substantially the same manner as in Example 1, except that no electrically conductive dummy patterns were provided.

[Measurement of Light Input Loss]

The same types of light emitting element and light receiving element as those used in Examples 1 and 2 and Comparative Example 1 were prepared. The light emitting element was ULM850-10-TT-00104U available from ULM Photonics GmbH, and the light receiving element was PDCA04-70-GS available from Albis Optoelectronics AG. The amount $I_o$ of light emitted from the light emitting element and directly received by the light receiving element was measured. Then, the opto-electric hybrid boards of Examples 1 and 2 and Comparative Example 1 were each looped by turning the interconnection portion B, and the resulting loop was laterally stretched with a force of 0.5 N and fixed. Light emitted from the light emitting element provided in the opto-electric module portion A' was received by the light receiving element provided in the opto-electric module portion A via the core of the optical waveguide W. The amount I of the light thus received was measured. Then, a light input loss [−10×log(I/$I_o$)] was calculated based on these values. As a result, the light input loss of the opto-electric hybrid board of Example 1 was 2.3 dB. The light input loss of the opto-electric hybrid board of Example 2 was 2.1 dB. In contrast, the light input loss of the opto-electric hybrid board of Comparative Example 1 was 4.0 dB. The light input loss was suppressed in the opto-electric hybrid board of Example 1, and further suppressed in the opto-electric hybrid board of Example 2.

[Breaking Strength]

As in the measurement of the light input loss, the opto-electric hybrid boards of Examples 1 and 2 and Comparative Example 1 were each looped by turning the interconnection portion B, and the resulting loop was laterally stretched. Then, the stretching load was increased. A stretching load (breaking strength) was measured when the interconnection portion B was broken. As a result, the opto-electric hybrid boards of Examples 1 and 2 each had a breaking strength of 10 N, and the opto-electric hybrid board of Comparative Example 1 had a breaking strength of 4 N. Thus, it was confirmed that the opto-electric hybrid boards of Examples 1 and 2 each had a much higher breaking strength than the opto-electric hybrid board of Comparative Example 1.

[Flexibility]

The opto-electric hybrid boards of Examples 1 and 2 and Comparative Example 1 were deformed by hands and, as a result, had substantially the same flexibility.

While specific forms of the embodiments of the present invention have been shown in the aforementioned inventive examples, the inventive examples are merely illustrative of the invention but not limitative of the invention. It is contemplated that various modifications apparent to those skilled in the art could be made within the scope of the invention.

The inventive opto-electric hybrid board can be widely used for a variety of electronic devices required to have flexibility, particularly for image display devices and mobile communication devices for consumer use, and for inspection apparatuses for industrial and medical use which are required to have a smaller size and a higher information processing capability.

REFERENCE SIGNS LIST

1: INSULATION LAYER
2: FIRST ELECTRIC WIRING
8: CORE
10, 10': OPTICAL ELEMENT
30: ELECTRICALLY CONDUCTIVE DUMMY PATTERN
A, A': OPTO-ELECTRIC MODULE PORTION
B: INTERCONNECTION PORTION
W: OPTICAL WAVEGUIDE

The invention claimed is:

1. An opto-electric hybrid board comprising:
an opto-electric module portion provided on at least one end portion of an elongated insulation layer, the opto-electric module portion including a first electric wiring of a first electrically conductive pattern and an optical element provided on a front surface of the insulation layer; and
an interconnection portion provided on a portion of the insulation layer extending from the opto-electric module portion, the interconnection portion including an elongated optical waveguide provided on a back surface of the insulation layer;
wherein the optical waveguide includes a light signal transmission core and is optically coupled with the optical element of the opto-electric module portion;
wherein an electrically conductive dummy pattern is provided on the front surface of the insulation layer in the interconnection portion for reinforcing the interconnection portion; and
wherein the electrically conductive dummy pattern is not designed for transmission of electricity.

2. The opto-electric hybrid board according to claim 1, wherein the electrically conductive dummy pattern respectively extends continuously along at least opposite longitudinal edges of the front surface of the insulation layer in the interconnection portion.

3. The opto-electric hybrid board according to claim 1, wherein the electrically conductive dummy pattern provided on the front surface of the insulation layer in the interconnection portion and the light signal transmission core of the optical waveguide provided on the back surface of the insulation layer are disposed in a vertically non-overlapping relation with each other, and
wherein the insulation layer intervenes between the electrically conductive dummy pattern and the light signal transmission core.

4. The opto-electric hybrid board according to claim 2, further comprising:
a second electric wiring of a second electrically conductive pattern longitudinally extending along an inward portion of the front surface of the insulation layer in the interconnection portion;
wherein the second electric wiring of the second electrically conductive pattern is provided between two portions of the electrically conducive dummy pattern continuously extending along at least opposite longitudinal edges of the front surface of the insulation layer in the interconnection portion.

5. The opto-electric hybrid board according to claim 4, wherein the second electric wiring provided between the two portions of the electrically conductive dummy pattern on the front surface of the insulation layer in the interconnection portion and the light signal transmission core of the optical waveguide provided on the back surface of the insulation layer are disposed in a vertically non-overlapping relation with each other, and
wherein the insulation layer intervenes between the second electric wiring and the light signal transmission core.

6. A method for producing the opto-electric hybrid board, the method comprising the steps of:
preparing a metal reinforcement layer;
forming an insulation layer on a front surface of the metal reinforcement layer;
simultaneously forming a first electrically conductive pattern of a first electric wiring in an opto-electric module portion and an electrically conductive dummy pattern of an interconnection portion to reinforce the interconnection portion, on the front surface of the insulation layer;
partly removing the metal reinforcement layer to form a through-hole for a light path and to uncover a back surface portion of the insulation layer in the interconnection portion;
fabricating an optical waveguide on the uncovered back surface portion of the insulation layer and a back surface of the metal reinforcement layer;
forming a light reflecting surface in a portion of the optical waveguide corresponding to an optical element mounting pad of the first electric wiring; and
mounting an optical element on the optical element mounding pad to optically couple the optical element with the optical waveguide,
wherein the electrically conductive dummy pattern is not designed for transmission of electricity.

7. A method for producing the opto-electric hybrid board, the method comprising the steps of:
preparing a metal reinforcement layer;
forming an insulation layer on a front surface of the metal reinforcement layer;

simultaneously forming a first electrically conductive pattern of a first electric wiring on the surface of the metal reinforcement layer in an opto-electric module portion, two portions of an electrically conductive dummy pattern extending along opposite longitudinal edges of an interconnection portion to reinforce the interconnection portion, and a second electrically conductive pattern of a second electric wiring extending longitudinally along an inward portion of the insulation layer between the two portions of the electrically conductive dummy pattern in the interconnection portion, on the front surface of the insulation layer;

partly removing the metal reinforcement layer to form a through-hole for a light path and to uncover a back surface portion of the insulation layer in the interconnection portion;

fabricating an optical waveguide on the uncovered back surface portion of the insulation layer and a back surface of the metal reinforcement layer;

forming a light reflecting surface in a portion of the optical waveguide corresponding to an optical element mounting pad of the first electric wiring; and mounting an optical element on the optical element mounding pad to optically couple the optical element with the optical waveguide, wherein the electrically conductive dummy pattern is not designed for transmission of electricity.

* * * * *